US008603730B2

(12) United States Patent
Knocke

(10) Patent No.: US 8,603,730 B2
(45) Date of Patent: Dec. 10, 2013

(54) PHOTOPOLYMERISABLE COMPOSITION

(75) Inventor: Frank Knocke, Ebersberg (DE)

(73) Assignee: XETOS AG, Hohenbrunn (DE)

( * ) Notice: Subject to any disclaimer, the term of this patent is extended or adjusted under 35 U.S.C. 154(b) by 1345 days.

(21) Appl. No.: 11/630,045

(22) PCT Filed: Jun. 22, 2005

(86) PCT No.: PCT/EP2005/006768
§ 371 (c)(1),
(2), (4) Date: Dec. 15, 2006

(87) PCT Pub. No.: WO2005/124456
PCT Pub. Date: Dec. 29, 2005

(65) Prior Publication Data
US 2010/0112458 A1 May 6, 2010

(30) Foreign Application Priority Data

Jun. 22, 2004 (DE) .......................... 10 2004 030 019

(51) Int. Cl.
G03F 7/00 (2006.01)
G03H 1/02 (2006.01)

(52) U.S. Cl.
USPC ..................... 430/281.1; 430/1; 430/2; 369/3

(58) Field of Classification Search
None
See application file for complete search history.

(56) References Cited

U.S. PATENT DOCUMENTS

| 2,760,663 | A | 12/1953 | Tatum |
| 2,850,445 | A | 9/1958 | Oster |
| 2,875,047 | A | 2/1959 | Oster |
| 3,074,974 | A | 1/1963 | Gebura |
| 3,097,096 | A | 7/1963 | Oster |
| 3,097,097 | A | 7/1963 | Oster et al. |
| 3,145,104 | A | 8/1964 | Oster et al. |
| 3,351,893 | A | 11/1967 | Parris et al. |
| 3,390,996 | A | 7/1968 | MacLachlan |
| 3,427,161 | A | 2/1969 | Laridon et al. |
| 3,479,185 | A | 11/1969 | Chambers, Jr. et al. |
| 3,549,367 | A | 12/1970 | Chang et al. |
| 3,554,753 | A | 1/1971 | Cohen et al. |
| 3,563,750 | A | 2/1971 | Walker et al. |
| 3,563,751 | A | 2/1971 | Cohen |
| 3,579,339 | A | 5/1971 | Chang et al. |
| 3,647,467 | A | 3/1972 | Grubb |
| 3,652,275 | A | 3/1972 | Baum et al. |
| 3,658,526 | A | 4/1972 | Haugh |
| 3,784,557 | A | 1/1974 | Cescon et al. |
| 3,854,950 | A | 12/1974 | Held |
| 3,993,485 | A | 11/1976 | Chandross et al. |
| 4,125,678 | A | 11/1978 | Stvan et al. |
| 4,162,162 | A | 7/1979 | Dueber |
| 4,168,982 | A | 9/1979 | Pazos |
| 4,171,977 | A | 10/1979 | Hasegawa et al. |
| 4,227,979 | A | 10/1980 | Humke et al. |
| 4,268,576 | A | 5/1981 | Montmarquet, Jr. |
| 4,268,667 | A | 5/1981 | Anderson |
| 4,311,783 | A | 1/1982 | Dessauer |
| 4,324,679 | A | 4/1982 | Carlson |
| 4,326,010 | A | 4/1982 | Bauer |
| 4,341,860 | A | 7/1982 | Sysak |
| 4,454,218 | A | 6/1984 | Dueber et al. |
| 4,535,052 | A | 8/1985 | Anderson et al. |
| 4,565,769 | A | 1/1986 | Dueber et al. |
| 4,622,286 | A | 11/1986 | Sheets |
| 4,716,094 | A | 12/1987 | Minonishi et al. |
| 4,970,129 | A | 11/1990 | Ingwall et al. |
| 5,176,188 | A | 1/1993 | Quinn et al. |
| 5,198,912 | A | 3/1993 | Ingwall et al. |
| 5,380,772 | A | 1/1995 | Hasegawa et al. |
| 5,395,862 | A | 3/1995 | Neckers et al. |
| 5,451,343 | A | 9/1995 | Neckers et al. |
| 5,474,719 | A | 12/1995 | Fan et al. |
| 5,725,970 | A | 3/1998 | Martin et al. |
| 5,930,011 | A | 7/1999 | Gambogi, Jr. et al. |
| 5,952,152 | A | 9/1999 | Cunningham et al. |
| 5,972,563 | A | 10/1999 | Steinmann et al. |

(Continued)

FOREIGN PATENT DOCUMENTS

| DE | 27 36 427 | | 2/1978 |
| DE | 40 39 382 | | 6/1991 |
| EP | 0 324 480 | | 7/1989 |
| EP | 0 324 482 | | 7/1989 |
| EP | 0 361 409 | A2 | 4/1990 |
| GB | 1550882 | A | 8/1979 |
| GB | 2 272 306 | A | 5/1994 |
| JP | 2-311570 | A | 12/1990 |
| JP | 05-077424 | A | 3/1993 |

(Continued)

OTHER PUBLICATIONS

Smirnova et al., "Photopolymers for holography: interconnection between holographic ...", Proc. SPIE vol. 3733 pp. 364-372 (1999).*
C. C. Guest, "Holography", Encyclopedia of Physical Science and Technology, vol. 6, pp. 507-519, R. A. Myers, editor, Academic Press, Orlando, Fl (1987).
H.-J. Timpe et al., "Dyes in Photoinitiator Systems", Kontakte, pp. 28-35 (1990).

(Continued)

Primary Examiner — Martin Angebranndt
(74) Attorney, Agent, or Firm — Edwards Wildman Palmer LLP; Christine C. O'Day; Nicholas J. DiCeglie, Jr.

(57) ABSTRACT

There is described a photopolymerisable composition comprising (a) 75 to 99% by weight of an ethylenically unsaturated monomer or a monomer mixture of different ethylenically unsaturated monomers, (b) 0.5 to 25% by weight of a triglyceride or a mixture of different triglycerides and (c) 0.1 to 10% by weight of a photoinitiator system which activates the polymerisation of the ethylenically unsaturated monomer (s) upon exposure to actinic radiation, wherein the composition is a homogeneous, clear and, at 20° C., liquid mixture. Furthermore, there are described elements manufactured from such photopolymerisable compositions and methods for the formation of light-resistant holograms therefrom. The photopolymerisable compositions are useful, in particular, as recording material for optical elements having refractive index modulation, in particular, holograms.

17 Claims, No Drawings

(56) References Cited

U.S. PATENT DOCUMENTS

| | | |
|---|---|---|
| 6,398,981 B1 | 6/2002 | Galstian et al. |
| 6,413,687 B1 | 7/2002 | Hattori et al. |
| 6,586,492 B1 | 7/2003 | Caiger et al. |
| 6,630,083 B1 | 10/2003 | Nunez et al. |
| 6,750,261 B1 | 6/2004 | Clear et al. |
| 2003/0035917 A1* | 2/2003 | Hyman ............ 428/67 |
| 2003/0067098 A1 | 4/2003 | Newell et al. |
| 2003/0124435 A1* | 7/2003 | Rich et al. ............ 430/1 |
| 2003/0124451 A1 | 7/2003 | Camillus et al. |
| 2003/0134105 A1 | 7/2003 | Toshine et al. |
| 2003/0206320 A1* | 11/2003 | Cole et al. ............ 359/15 |
| 2003/0214690 A1 | 11/2003 | Escuti et al. |
| 2005/0026081 A1 | 2/2005 | Kawamura |
| 2005/0056954 A1* | 3/2005 | Devlin et al. ............ 264/1.32 |
| 2007/0187947 A1* | 8/2007 | Heeschen ............ 283/86 |

FOREIGN PATENT DOCUMENTS

| | | |
|---|---|---|
| JP | 05-084539 A | 4/1993 |
| JP | 06-200204 A | 7/1994 |
| JP | 2000-505085 A | 4/2000 |
| JP | 2001-117226 A | 4/2001 |
| JP | 2002-507230 A | 3/2002 |
| JP | 2006010717 A | 1/2006 |
| WO | WO-97/30588 A1 | 8/1997 |
| WO | WO-99/00478 A1 | 1/1999 |
| WO | 03046661 A1 | 6/2003 |
| WO | 03/064061 A1 | 8/2003 |
| WO | WO-2005/124460 A1 | 12/2005 |
| WO | WO-2005124456 A2 | 12/2005 |

OTHER PUBLICATIONS

J. Jakubiak et al., "Photoinitiators for visible light polymerization", Polymery, vol. 44, pp. 447-461 (1999).

D. F. Eaton, "Dye Sensitized Photopolymerization", Adv. in Photochemistry, G.S. Hammond and K. Gollnick, editors, Wiley-Interscience, NY, vol. 13, pp. 427-487 (1986).

Optics in Information Systems, 15(1):1-12 (2004)

Handbook of Chemistry and Physics, 63rd Edition, pp. C-768 & D-225 (1982-83).

* cited by examiner

PHOTOPOLYMERISABLE COMPOSITION

FIELD OF THE INVENTION

The present invention relates to photopolymerisable compositions and elements manufactured therefrom. The photopolymerisable compositions are particularly useful as recording material for optical elements with refractive index modulation, in particular, holograms. Furthermore, the present invention relates to a method of forming a light-resistant hologram.

Background of the invention

A phase hologram is characterised by a pattern of regions of different refractive indices within a recording material. Methods for producing holograms and the relevant theory may be found in the literature, for example in "Holography" by C. C. Guest (Encyclopedia of Physical Science and Technology, Vol. 6, pp. 507-519, R. A. Meyers, Ed., Academic Press, Orlando, Fla., 1987).

A variety of different materials are useful as recording material for holograms, for example, silver halide emulsions or cured dichromate-treated gelatine. A useful discussion of materials which have been known for some time may be found, for example, in "Holographic Recording Materials" by H. M. Smith, Ed. (Topics in Applied Physics, Vol. 20, Springer Verlag, 1977).

Photopolymers as recording material have also been known for some time. A distinction can, in principle, be made between those which have to be developed in a wet process and those which do not require a step of chemical development. The latter systems were described already in 1969 by Haugh in U.S. Pat. No. 3,658,526. They essentially consist of a polymeric binder, monomer and an initiator system and they are useful for recording highly resolved holograms. Since then, further monomer binder photopolymers have been described in the state of the art, which exhibit improved properties relative to the material originally described. DuPont now commercialises a holographic material under the trade mark OmniDex® (see EP 0 324 480).

The aforementioned photopolymer systems which contain a polymeric binder form an essentially solid film layer. In contrast thereto, binder-free systems have been described which are essentially liquid until exposure takes place (see for example U.S. Pat. No. 3,993,485 or N. Smirnova, Optics in Information Systems, February 2004, p. 9).

However, with the majority of essentially solid monomer binder photopolymers it is necessary to subject the film after the holographic exposure not only to irradiation by UV light across its entire area, but additionally to a further time-consuming thermal treatment in order to stabilise/fix the hologram and/or to increase the diffraction efficiency. Further measures to increase the diffraction efficiency comprise, for example, treating the hologram with solvent and/or liquid monomer. Many production processes, however, require minimal production times and/or maximal throughput and simple, cost-efficient processes for the production of holograms, which is why a laborious and time-consuming post-treatment is disadvantageous. Therefore, actually self-developing and effective photopolymers as holographic recording materials are still the subject of intensive research and development.

Until now, holograms with a diffraction efficiency of more than 80% can be produced essentially only by using a photopolymer composition which contains a high proportion of a thermoplastic binder (for example, PVAC, PMMA). However, this results in the following problems in processing: A high proportion of binder of a non-liquid polymer requires a high proportion of solvent in order to obtain a solution or emulsion for coating. This results in a long drying time (evaporation of the solvent) before the photolayer can be exposed. Furthermore, the layer will shrink depending on the proportion of solvent. In order to obtain a layer with a thickness of 20 micrometres the material must be applied, for example, with a knife spacing of 150 micrometres. The necessary large thickness of the wet layer makes it impossible or difficult to use known printing processes. Moreover, when silkscreen printing is employed, the use of rapidly drying solvents may result in adhesiveness of the printing screen. Also, the long thermal post-treatment times after exposure (DuPont quotes a drying time of one hour at 120° C. for the aforementioned OmniDex® material) necessitate long production lines to achieve high production rates and requires cumbersome and large machinery.

DESCRIPTION OF THE INVENTION

The object of the present invention, therefore, is to provide a holographic recording material which avoids the aforementioned disadvantages of known recording materials and, in particular, makes it possible to use high processing speeds. Furthermore, the holographic elements produced from the recording material should have a high refractive index modulation and should exhibit high long-term stability, in particular, thermal and mechanical stability.

This object is achieved according to the present invention by a photopolymerisable composition comprising (a) 75 to 99% by weight of an ethylenically unsaturated monomer or a monomer mixture of different ethylenically unsaturated monomers, (b) 0.5 to 25% by weight of a triglyceride or a mixture of different triglycerides and (c) 0.1 to 10% by weight of a photoinitiator system which activates the polymerisation of the ethylenically unsaturated monomer(s) upon exposure to actinic radiation; wherein the composition is a homogeneous, clear and, at 20° C., liquid mixture.

Furthermore, the present invention provides an element containing a component which is obtainable by exposure of the photopolymerisable composition according to the present invention to actinic radiation.

Furthermore, the present invention provides a method of forming a light-resistant hologram in a photopolymerisable layer on a substrate surface comprising the exposure of a layer of the photopolymerisable composition according to the present invention to modulated radiation carrying holographic information.

The invention is based on the finding that photopolymerisable compositions as holographic recording materials can advantageously be produced by using triglycerides. This makes it possible to achieve an increased refractive index modulation compared to photopolymerisable compositions not containing triglycerides without necessitating a time-consuming thermal post-treatment. Therefore, contrary to conventional materials, such self-developing recording materials are suitable for very fast and cost-efficient production methods. Furthermore, the holograms manufactured therefrom are characterised by a very high long-term stability, in particular, improved thermal, mechanical and chemical stability (for example solvent resistance).

The composition according to the present invention does, in particular, not require any solvent and does not require any thermal post-treatment. The composition can be exposed immediately after application on a substrate. Since wet application of the composition is required only at a thickness of about 8 to 15 micrometres, known printing techniques, such as silkscreen, intaglio, pad or flexographic printing can be used. After exposure, the layer is solid.

Moreover, the use of triglycerides in the manufacture of photopolymerisable compositions as holographic recording materials has further important advantages: The exposed photopolymer exhibits reduced surface adhesion since the triglyceride also acts as a release agent. Therefore, the exposed hologram can be removed easily and completely from a substrate, such as glass. This property, too, is highly advantageous for mass production because it makes it possible to use nonwearing copy masters with a glass surface for producing contact copies. The complete removal of the non-sticking layer keeps the cleaning effort to a minimum. Moreover, when the liquid photopolymerisable composition is printed directly onto the master, index matching is no longer required. This is the application of a liquid between the master and the hologram layer, which liquid has about the same refractive index as the two layers. In conventional contact copying processes, index matching prevents undesirable interference phenomena (Newton's rings). These result from reflections which occur, in particular, where the two layers are not in direct contact with each other, for example, due to dust particles or some minor unevenness. Moreover, the levelling of scratches and other unevenness of the carrier material (master) improves the optical quality of the copy.

The complete contact between the recording material and the master can also be used in order to cast or mould surface structures on the master. Such surface structures can be, in particular, embossed holograms. Thereby, it becomes possible to copy both the surface structure as well as volume holographic information of the master in a single process step.

The photopolymerisable composition of the present invention contains an ethylenically unsaturated monomer or a monomer mixture of different ethylenically unsaturated monomers.

The ethylenically unsaturated monomers can have the following general structural units:

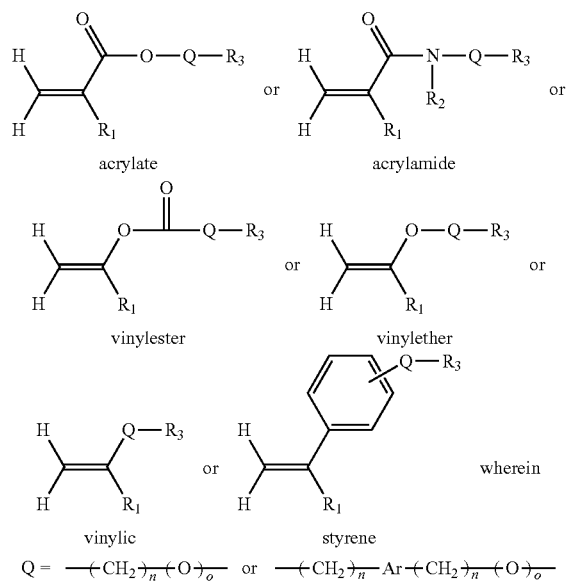

$Q = -(CH_2)_n-(O)_o-$ or $-(CH_2)_n-Ar-(CH_2)_n-(O)_o-$ wherein n, m=0-12; o=0, 1; and Ar is a mono- or polynuclear substituted or unsubstituted aromatic or heterocyclic aromatic residue, wherein the residue $R_1$ is H, methyl or ethyl and wherein the residues $R_2$ and $R_3$ are independently selected from the group consisting of alkyl, alkenyl, alkynyl, alkoxy, acyl and acyloxy residues, which may be straight-chained or branched, unsubstituted or substituted, substituted or unsubstituted aryloxy residues, substituted or unsubstituted aromatic residues or heterocyclic residues, unsubstituted or substituted alicyclic hydrocarbon residues, aliphatic, aromatic and aliphatic-aromatic amino, carboxylic acid, amido and imido residues, hydroxy, amino, cyano, nitro, halogen atoms or hydrogen atoms and combinations of the aforementioned residues, wherein the substituted residues may be substituted with $C_1$-$C_{12}$ alkyl, $C_1$-$C_{12}$ alkoxy, hydroxy, carboxy, carbonyl, amino, amido, imido residues, halogen atoms, aromatic residues or combinations thereof.

Examples of suitable ethylenically unsaturated monomers are substituted or unsubstituted styrene monomers, acrylic acid, α-alkylacrylic acid, acrylic acid esters, α-alkylacrylic acid esters, the alcohol component of which may be a substituted or unsubstituted aliphatic or aromatic residue with 2-50 carbon atoms, acrylamides, α-alkylacrylamides, wherein alkyl has the aforementioned meaning, vinyl ester, vinyl alcohol, vinyl ether and other substituted vinylic monomers, substituted with substituted or unsubstituted aliphatic or aromatic residues with 2-50 carbon atoms.

Preferred examples of suitable ethylenically unsaturated monomers are butyl(meth)acrylate, phenyl(meth)acrylate, benzyl(meth)acrylate, isobornyl(meth)acrylate, cyclohexyl (meth)acrylate, 2-phenoxyethyl(meth)acrylate, 1H,1H,2H, 2H-perfluorooctyl(meth)acrylate, 2,2,2-trifluorethyl(meth) acrylate, heptafluoropropyl(meth)acrylate, 1,1,1,3,3,3-hexafluoroisopropyl(meth)acrylate, 2,2,3,3-tetrafluoropropyl(meth)acrylate, 2,2,3,3,4,4,4-heptafluorobutyl(meth)acrylate, 2,2,3,3,4,4,5,5,-octafluoropentyl(meth)acrylate, N,N-diethylaminoethylacrylate, ethoxyethyoxyethylacrylate, 2-(p-chlorophenoxy)ethylacrylate, p-chlorophenylacrylate, 2-phenylethyl(meth)acrylate, pentachlorophenylacrylate, phenylacrylate, p-chlorostyrene, n-vinylcarbazole, 1-vinyl-2-pyrrolidone, 2-chlorostyrene, 2-bromostyrene, methoxystyrene, phenolethoxylacrylate, 2-(p-chlorophenoxy)ethylacrylate, 2-(1-naphthyloxy)ethylacrylate, hydroquinonemonomethacrylate and 2-[β-(N-carbazolyl) propionyloxy]ethylacrylate.

Particularly preferred ethylenically unsaturated monomers are N-vinylcarbazole, ethoxyethoxyethylacrylate, 2-naphthylacrylate, 2-phenoxyethylacrylate, 2-phenoxyethylmethacrylate, phenolethoxylatacrylate, 2-(p-chlorophenoxy) ethylacrylate, p-chlorophenylacrylate, phenylacrylate, 2-phenylethylacrylate, 2-(1-s naphthyloxy)ethylacrylate, t-butylacrylate, isobornylacrylate, cyclohexylacrylate, N,N-diethylaminoethylacrylate, acrylamide, ethoxyethoxyethylacrylate, 1H,1H,2H,2H-perfluorooctylmethacrylate and pentafluoroethylacrylate.

The ethylenically unsaturated monomer is preferably at least difunctional. Difunctional ethylenically unsaturated monomers have two C—C double bonds in the molecule, i.e., they contain for example two of the aforementioned structural units. A difunctional ethylenically unsaturated monomer can, for example, contain two acrylate or methacrylate groups.

The components of the ethylenically unsaturated monomer in the photopolymersiable composition of the present invention can consist essentially exclusively of one or more difunctional or higher functional monomers, i.e., the composition can be essentially free of monofunctional ethylenically unsaturated monomers. Preferably, the amount of monofunctional ethylenically unsaturated monomers in the composition of the present invention is less than 10% by weight, more preferably less than 5% by weight.

The use of difunctional or higher functional monomers results, in particular, in an especially high thermal and mechanical stability of the holographic elements and is advantageous, in particular, in the manufacture of reflective holograms.

Preferred difunctional ethylenically unsaturated monomers are so ethoxylated bisphenol-A-diacrylates, especially compounds of the following formula

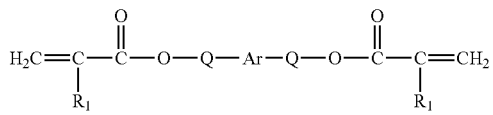

wherein $R_1$, Q and Ar have the meanings indicated above.

A particularly preferred difunctional ethylenically unsaturated monomer is the compound of the following structural formula:

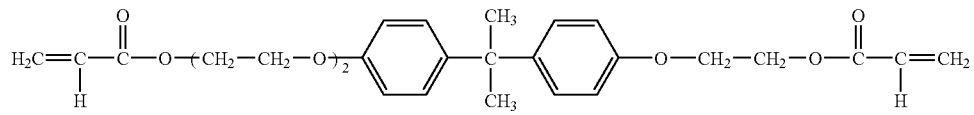

In order to increase the viscosity of the photopolymerisable composition and to reduce the shrinkage upon exposure, the following compounds can also be used as ethylenically unsaturated monomers: (i) epoxyacrylates, in particular, epoxyacrylates based on difunctional bisphenol A, such as, for example, the epoxyacrylate available from Sartomer Company, Inc. (USA) under the trade name CN124, as well as (ii) fatty acid modified epoxyacrylates, such as, for example, the fatty acid modified epoxyacrylate available from Sartomer Company, Inc. (USA) under the trade name CN2101.

The viscosity of the ethylenically unsaturated monomer or monomer mixture at room temperature is preferably at least 900 mPa·s.

Furthermore, the photopolymerisable composition of the present invention contains a triglyceride or a mixture of different triglycerides.

Suitable triglycerides are generally compounds of the following general structural formula

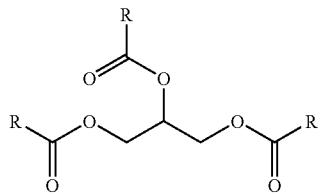

wherein the R represent, independently of each other, a fatty acid residue; each R contains preferably 6 to 22, more preferably 8 to 18 carbon atoms.

Naturally occurring oils and fats, such as ricinus or castor oil, coconut oil, palm kernel oil and mixtures thereof can also be employed as triglyceride. Derivatives (for example hydrogenation products) of such naturally occurring fats and oils can also be employed. Such naturally occurring oils or fats generally are or contain mixtures of different triglycerides.

Alkoxylated triglycerides, preferably ethoxylated triglycerides, such as, for example, alkoxylated ricinus or castor oil, especially ethoxylated ricinus or castor oil can also be used as triglyceride.

A particularly preferred triglyceride is the triglyceride of ricinoleic acid, which is a main component of ricinus or castor oil.

The triglyceride is preferably selected so that the modulus of the difference between the refractive index (n) of the ethylenically unsaturated monomer or monomer mixture and the refractive index of the triglyceride (i.e., |n(monomer)−n(triglyceride)|) is at least 0.01, more preferably at least 0.05, and most preferably at least 0.1.

Furthermore, the photopolymerisable composition of the present invention contains a photoinitiator system which activates the polymerisation of the ethylenically unsaturated monomer(s) upon exposure to actinic radiation. The essential component of such a system is preferably at least one radical-forming polymerisation initiator.

Preferably, photoinitiators are used which are activated by visible light, i.e., by light having a wavelength of >300 nm, preferably light with a wavelength in the range of 400-800 nm. Such initiators preferably have an absorption coefficient of 1000 or more for light having wavelength of more than 300 nm. Such photoinitiators can initiate the polymerisation reaction of the ethylenically unsaturated monomer upon irradiation with visible light (i.e., light having a wavelength of >300 nm, preferably light with a wavelength of 400-800 nm).

Radical-forming polymerisation initiators are known, see, for example, Timpe, H. J. and S. Neuenfeld, "Dyes in photoinitiator systems", Kontakte (1990), pp. 28-35 and Jakubiak, J. and J. F. Rabek, "Photoinitiators for visible light polymerisation", Polimery (Warsaw) (1999), 44, pp. 447-461.

Amongst the suitable radical-forming polymerisation initiators which are activated by UV radiation and that are generally inactive at temperatures up to 185° C., there are the substituted or unsubstituted multi-nuclear quinones; these are compounds with two intracyclic carbon atoms in a conjugated carbocyclic ring system, for example 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone-α-sulfonic acid, 3-chloro-2-methylanthraquinone, retenquinone, 7,8,9,10-tetrahydronaphthacenequinone and 1,2,3,4-tetrahydrobenz[a]anthracene-7,12-dione. Further photoinitiators which are also useful, although some of them may be thermally active at temperatures as low as 85° C., are described in U.S. Pat. No. 2,760,663 and these comprise vicinal ketaldonyl alcohols, such as benzoin, pivaloin, acyloinethers, for example, benzoinmethyl and ethylether, α-hydrocarbon substituted aromatic acyloins, including α-methylbenzoin, α-allylbenzoin and α-phenylbenzoin.

Useful as initiators are photoreducible dyes and reducing agents, such as those described in U.S. Pat. Nos. 2,850,445, 2,875,047, 3,097,096, 3,074,974, 3,097,097, 3,145,104 and 3,579,339, as well as dyes of the class of phenazines, oxazines and quinones; Michler's ketone, benzophenone, 2,4,5-triphenylimidazolyl dimers with hydrogen donors and their mixtures, as described in U.S. Pat. Nos. 3,427,161, 3,479,185, 3,549,367, 4,311,783, 4,622,286 and 3,784,557. A useful discussion of dye-sensitised photopolymerisation may be found in "Dye Sensitized Photopolymerization" by D. F. Eaton in Adv. in Photochemistry, Vol. 13, D. H. Volman, G. S. Hammond and K. Gollnick, Eds., Wiley-Interscience, New York, 1986, pp. 427-487. In the same way, the cyclohexadienone compounds of U.S. Pat. No. 4,341,860 are also useful as initiators. The useful photoinitiators comprise CDM-HABI, i.e., 2-(o-chlorophenyl)-4,5-bis(m-methoxyphenyl)-imidazole-dimer; o-Cl-HABI, i.e., 2,2'-bis(o-chlorophenyl)-4,4',5,5'-tetraphenyl-1,1'-biimidazole; and TCTM-HABI, i.e., 2,5-bis(o-chlorophenyl)-4-(3,4-dimethoxyphenyl)-1H-imidazole-dimer, each of which is typically used with a hydrogen donor, for example, 2-mercaptobenzoxazole.

A particularly preferred photoinitiator is 2-benzyl-2-dimethylamino-1-(4-morpholinophenyl)butanone-1, which is available from Ciba under the designation "irgacure 369" and which is preferably used in an amount of 0.1 to 10% by weight.

As useful photoinitiators there may also be used photopolymerisation initiators of the formula S-L-A, as described in US patent application 2005/0026081, wherein, in the aforementioned formula, S represents a light-absorbing moiety having a chromophoric group, resulting in absorption coefficients of 1000 or more for wavelength of more than 300 nm; A represents an active moiety which interacts with the light-absorbing moiety S in order to form a free radical; and L represents a linking group which joins the light-absorbing moiety S and the active moiety A together. Suitable examples for photopolymerisation initiators of the aforementioned formula are described in the aforementioned US patent application.

The aforementioned photoinitiators can be used alone or in combination.

Together with the aforementioned photoinitiators there may be employed sensitising agents, such as, for example, methylene blue and the sensitising agents described in U.S. Pat. Nos. 3,554,753, 3,563,750, 3,563,751, 3,647,467, 3,652, 275, 4,162,162, 4,268,667, 3,351,893, 4,454,218, 4,535,052 and 4,565,769 which are expressly referred to herein. The particular preferred sensitising agents comprise the following: DBC, i.e., 2,5-bis[(4-diethylamino-2-methylphenyl)methylene]cyclopentanone; DEAW, i.e., 2,5-bis[(4-diethylaminophenyl)methylene]cyclopentanone; dimethoxy-JDI, i.e., 2,3-dihydro-5,6-dimethoxy-2-[(2,3,6,7-tetrahydro-1H,5H-benzo[i,j]quinolizine-9-yl)methylene]-1H-indene-1-one; and Safranin O, i.e., 3,7-diamino-2,8-dimethyl-5-phenyl-phenaziniumchloride.

A particularly preferred photoinitiator comprises the compounds of the following structural formula which is available from Ciba Specialty Chemicals Inc. under the designation "CGI 7460":

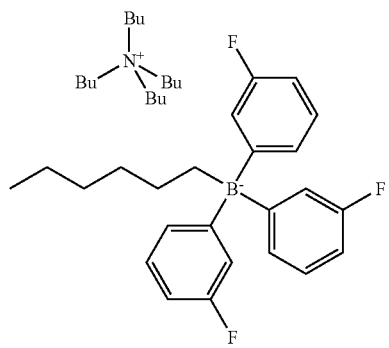

For adaptation to the selected processing method or to the application of the photopolymerisable composition and for improving the printability, surface adhesion, viscosity, film-forming property, flexibility, hardness, cold, heat and weathering resistance, the composition can contain various additives which are known as such. These should be well miscible and should not deteriorate the diffraction efficiency. Non-volatile substances can even provide long-term improvements in diffraction efficiency of thin layers, in particular, by selecting such additives that increase the difference in refractive index between the ethylenically unsaturated monomer and the other components of the photopolymerisable composition. If the triglyceride component has a lower refractive index than the component of the ethylenically unsaturated monomer, the additive(s) should also have as low a refractive index as possible. Therefore, in this case, apart from known polymers with a low refractive index, such as polyvinyl acetate, in particular, fluorinated or silanised polymers may be considered. In order to achieve good diffusion properties, the molecular weight of the additive should not be too high.

The aforementioned additives and those described in detail below can generally be used in an amount from 0.01 to 25% by weight, preferably 0.01 to 10% by weight.

The photopolymerisable compositions can contain a plasticiser in order to enhance the modulation of refractive index of the composition containing an image. Plasticisers can be used in amounts ranging from about 2 to about 25% by weight, preferably 5 to about 15% by weight. Useful plasticisers comprise triethyleneglycol, triethyleneglycoldiacetate, triethyleneneglycoldipropionate, triethyleneglycoldicaprylate, triethyleneglycoldimethylether, triethyleneglycolbis(2-ethylhexanoate), tetraethyleneglycoldiheptanoate, polyethyleneglycol, polyethyleneglycolmethylether, isopropylnaphthalene, diisopropylnaphthalene, polypropyleneglycol, glyceryltributyrate, diethyladipate, diethylsebacate, dibutylsuberinate, tributylphosphate, tris(2-ethylhexyl) phosphate, Brij® 30 [$C_{12}H_{25}(OCH_2CH_2)_4OH$], Brij® 35 [$C_{12}H_{25}(OCH_2CH_2)_{20}OH$], as well as n-butylacetate.

Particularly preferred plasticisers are triethyleneglycoldicaprylate, tetraethyleneglycoldiheptanoate, diethyladipate, Brij® 30 and tris(2-ethylhexyl)phosphate.

If desired, other conventional components used in photopolymer systems may be employed in the compositions and elements of the present invention. These components comprise: optical brighteners, UV radiation absorbing materials, thermal stabilisers, hydrogen donors, oxygen scavengers or antioxidants and release agents. These additives can also comprise polymers or copolymers.

The optical brighteners useful in the method of the present invention comprise those described in U.S. Pat. No. 3,854, 950 cited above. A preferred optical brightener is 7-(4'- chloro-6'-diethylamino-1',3',5'-triazine-4'-yl)amino-3-phenylcoumarin. UV radiation absorbing materials which are useful in the present invention are also described in U.S. Pat. No. 3,854,950.

The useful thermal stabilisers comprise: hydroquinone, phenidone, p-methoxyphenol, alkyl- and aryl-substituted hydroquinones and quinones, tert-butylcatechol, pyrogallol, copper resinate, naphthylamines, β-naphthol, copper(I)-chloride, 2,6-di-tert-butyl-p-cresol, phenothiazin, pyridine, nitrobenzene, dinitrobenzene, p-toluquinone and chloranil. The dinitroso dimers disclosed in U.S. Pat. No. 4,168,982 are also useful. Normally, an inhibitor for the thermal polymerisation is also present in order to increase the stability of the photopolymerisable composition during storage.

The hydrogen donor compounds useful as chain transfer reagents in the photopolymer compositions comprise: 2-mercaptobenzoxazole, 2-mercaptobenzothioazole etc. as well as various kinds of compounds, for example (a) ethers, (b) esters, (c) alcohols, (d) compounds containing allylic or benzylic hydrogen, such as cumol, (e) acetals, (f) aldehydes, and (g) amides, as described in column 12, lines 18 to 58 of U.S. Pat. No. 3,390,996, which is expressly referred to herein.

The photopolymerisable composition preferably contains one or more antioxidants, such as, for example vitamin C (ascorbic acid) or vitamin E. Vitamin C can be used as such or in modified form. Ascorbyl palmitate can be used as modified fat soluble vitamin C. Furthermore, a form of vitamin C (ascorbic acid) solubilised by means of polysorbate and medium chain triglyceride as micells or vesicles of about 50 nm can also be used; such a solubilised form is available from BASF under the trade name Solu C 10.

Compounds which have proven useful as release agents are described in U.S. Pat. No. 4,326,010. A preferred release agent is polycaprolactone.

The photopolymerisable composition can also contain one or more polymeric binders which is or are selected from the group comprising polymethylmethacrylate and polyethylmethacrylate, polyvinylesters, such as polyvinylacetate, polyvinylacetate/acrylate, polyvinylacetate/methacrylate and partially hydrolysed polyvinylacetate, ethylene/vinylacetate copolymers, vinylchloride/carboxylic acid ester copolymers, vinylchloride/acrylic acid ester copolymers, polyvinylbutyral and polyvinylformal, butadiene and isoprene polymers and copolymers and polyethyleneoxide from polyglycols with an average molecular weight of about 1,000 to 1,000,000 g/mol, epoxides, such as acrylate or methacrylate residue containing epoxides, polystyrenes, cellulose esters, such as cellulose acetate, celluloseacetatesuccinate and celluloseacetatebutyrate, celluloseethers, such as methylcellulose and ethylcellulose, polycondensates, such as polycarbonates, polyesters, polyamides, such as N-methoxymethylpolyhexamethylene-adipamide, polyimides, polyurethanes. The aforementioned polymeric binders can be used, for example, in an amount of 0.001 to 10% by weight.

The photopolymerisable composition can also contain one or more wetting agents (in particular, fluorocarbopolymers, such as, for example, Schwego-Fluor 8038™, or fluoro surfactants, such as, for example, 3M Fluorad FC-4430™), flow-control agents (in particular, glycolic acid-n-butylester or polyether modified polydimethylsiloxanes, such as, for example, ADDID 130™), antifoaming agents (in particular, antifoaming agents based on fluorosilicone oils, such as, for example, ADDID 763™), adhesion or coupling agents (in particular, diamino trimethoxy functional silane adhesion or coupling agents, such as, for example, ADDID 900™ or glycidyl trimethoxy trifunctional silane adhesion or coupling agents, such as, for example, ADDID 911™, vinyltriethoxysilane or 3-methacryloxypropyltrimethoxysilane), or surface additives (in particular, polyether modified acrylic functional polydimethylsiloxanes, such as, for example, BYK-UV 3500™, polyether modified polydimethylsiloxanes, such as, for example BYK-UV 3510™, or polyether modified acrylic functional polydimethylsiloxanes, such as, for example BYK-UV 3530™). The aforementioned products under the trade names of "ADDID" or "BYK" are available from Wacker and BYK Chemie, respectively.

The photopolymerisable composition can also contain nanoscale particles (nanoparticles), for example of $TiO_2$, $SiO_2$ or Au, which may optionally be coupled to monomers (such materials are available, for example, under the trade name "Nanocryl").

Moreover, the photopolymerisable composition can also contain polyethyleneglycol.

The photopolymerisable composition of the present invention is essentially free of organic solvents. Preferably, the composition contains at most 5% by weight, more preferably at most 1% by weight of organic solvents.

All amounts stated in this specification and in the claims relate to the weight of the components relative to the total weight of the polymerisable composition of the present invention.

The photopolymerisable composition of the present invention may be used for manufacturing optical elements, in particular, elements with refractive index modulation. These are, in particular, holograms. Transmission holograms as well as reflective holograms may be manufactured.

Holograms are generally made by allowing a modulated radiation carrying holographic information to act on a layer of the photopolymerisable composition which has been applied to a carrier substrate.

As carrier substrate for the manufacture of the holographic elements of the present invention there may be used glass, plastic, in particular PET or cellulose di- or triacetate, or paper. During the holographic exposure, the photopolymerisable composition may be placed, for example, between two glass plates.

Residual monomers, which have not reacted after the holographic exposure, can be polymerised by subsequent UV irradiation of the layer as a whole. The holographic exposure and/or the aforementioned UV irradiation of the layer as a whole are preferably carried out under exclusion of oxygen, as is done with other radical systems.

The optical element of the present invention can, in the simplest case, be a foil or sheet which is directly obtained by the holographic exposure of a layer of the composition of the present invention on one or between two inert carrier substrates and, optionally, subsequent UV irradiation of the layer as a whole. Such an element can be used, for example, as a security feature.

The element can be manufactured, in particular, in a contact copying process. In this process, the photopolymerisable composition is applied directly to a holographic copy master with a glass surface. By complete removal of the non-adhesive layer, the cleaning effort is kept to a minimum. Index matching can also be dispensed with when the composition of the present invention is used.

The photopolymerisable compositions of the present invention can also be used for casting or moulding of surface structures, in particular, of surface holograms (embossed holograms).

The photopolymerisable compositions of the present invention can also be used for the manufacture of optical elements with refractive index gradient structure, such as, for example, photonic crystals, optical fibres or waveguides, diffusors, angle-selective diffusors, data storage devices, head up displays, planar gradient index lenses, antireflective layers or Fabry Perot filters.

Furthermore, the photopolymerisable composition of the present invention can be used for the manufacture of optical elements, such as, for example: direction selective diffusing screens, photonic crystals, plastic lasers, colour filters, dichroitic beam splitters, dielectric and dichroitic mirrors, is optical heat and pressure sensors (the layer thickness and, therefore, the colour or angle-dependent reflection or transmission spectrum may vary depending on pressure and temperature) or chemical sensors (chemical substances may be detected by doping with corresponding absorbing substances or receptor molecules (receptors), wherein either the thickness or the refractive index modulation and, therefore, the diffraction efficiency, the refractive angle or the measurable colour spectrum are altered by docking of the chemical substance to the receptor).

Elements of the present invention without gradient structure can be used, for example, for rapid prototyping, for optical lithography, as membrane filters, as foils or sheets, as semipermeable foil or sheet, as diffractive optical elements or as moulding composition.

EXAMPLES

The invention will be explained in more detail below by reference to examples.
General Information
Compounds, the preparation of which is not described herein, are commercially available.

Example 1

1. Preparation of a Coating Solution of a Photopolymerisable Composition of the Present Invention A coating solution of the components listed in the following table was prepared.

| Component | Amount |
| --- | --- |
| Monomer "SR-349" (available from Sartomer) | 0.5 ml |
| Mixture of ricinus or castor oil and palm kernel oil (1:1) | 0.05 ml |
| Photoinitiator "CGI 7460" (available from Ciba Specialty Chemicals Inc.; 40% solution in dichloromethane) | 0.01 ml |
| Sensitising agent "Safranin O" (ca. 3% solution in ethanol) (0.1 g Safranin O in 3 g ethanol) | 0.005 ml |

-continued

| Component | Amount |
| --- | --- |
| Wetting agent "Schwego-Fluor 8083" (available from Fa. Bernd Schwegmann) | 0.005 ml |

The monomer "SR-349" is an ethoxylated bisphenol-A-diacrylate of the following structural formula:

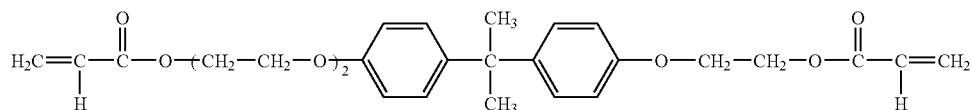

The photoinitiator "CGI 7460" is a compound of the following structural formula:

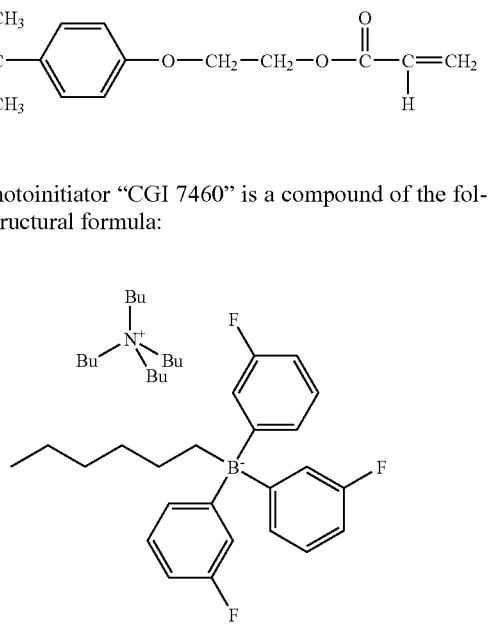

The sensitising agent "Safranin O" is the compound 3,7-diamino-2,8-dimethyl-5-phenyl-phenaziniumchloride.

The wetting agent Schwego-Fluor 8038™ is a fluorocarbo polymer.

The coating solution was prepared as follows:

The oil mixture was provided first. The monomer was than added and mechanically stirred until a clear solution had formed (ca. 1 minute). Then the solution of the photoinitiator was added dropwise and also well stirred. Subsequently, the solution of the photosensitising agent and the wetting agent were mixed in. Finally, the coating solution was heated in an oven for 5-10 minutes at 120° C. and was then ready for use.

2. Generation of a Reflective Hologram

One drop of the coating solution described in step 1 above was placed on a glass slide and covered with a second glass slide. By gently pressing and after a waiting time of some minutes, the drop spread between the two plates to give a layer with a thickness of about 15 micrometres.

This sample was placed in an exposure device where it was irradiated from both sides with coherent laser light. In the optical device, the light of a Neodym-YAG laser (model COMPASS of Fa. Coherent) having a wavelength of 532 nm was broadened to a parallel beam and split into two beams by means of a beam splitter cube. The beams are deflected by means of mirror so that one beam hits the other side of the sample at a right angle and the second beam hits the reverse side at an angle of 45 degrees. By the superposition of the two coherent beams, an interference pattern of bright and dark lines with a spacing of about 183 nm is formed within the material. The lines or planes are oriented at an angle of about 14 degrees within the recording layer. The light intensity pattern results in locally varying polymerisation rates so that a corresponding pattern with different refractive indices is generated.

In the exposure of the sample, the two beams each had an intensity of 1.3 mW/cm². The exposure time was 15 seconds. The sample was then irradiated with UV light (120 mW/cm² at 365 nm) for one minute in order to complete the polymerisation process.

3. Measurement of the Diffraction Efficiency

The diffraction efficiency may be calculated from the ratio of the intensity of the laser beam reflected or diffracted by the hologram structure ($I_1$) to the non-reflected portion passing through ($I_0$), according to the following equation:

$$BWG = \frac{I_1}{I_0 + I_1}$$

For the measurement, the sample was illuminated with the unbroadened laser beam (532 nm) and the angle of incidence was selected so that the reflected beam reached a maximal intensity.

Using the Kogelnik theory (see "Coupled Wave Theory for Thick Hologram Gratings", The Bell System Technical Journal of May 23, 1969), the refractive index amplitude ($\Delta n$) of the lattice structure can be calculated from the diffraction efficiency (BWG) and the layer thickness d according to the following formula:

$$\Delta n = \operatorname{arctanh}(\sqrt{BWG}) \frac{\lambda \cos(\varphi)\cos(\gamma)}{\pi d}$$

Wherein:
$\varphi = 0.5 (\alpha_m - \beta_m)$
$\gamma = \alpha_m - \varphi$
$\alpha_m = \arcsin(\sin(\alpha)/n)$, $\beta_m = \arcsin(\sin(\beta)/n)$
$\alpha$=angle of incidence of the 1st beam
$\beta$=angle of incidence of the second beam
n=refractive index of the recording material The measured diffraction efficiency (BWG), the layer thickness and the refractive index amplitude ($\Delta n$) resulting therefrom are summarised in Table 1.

TABLE 1

| Layer thickness [μm] | BWG [%] | Δn |
|---|---|---|
| 14 | 89 | 0.02 |

The invention claimed is:
1. A photopolymerisable composition comprising:
(a) 75 to 99% by weight of an ethylenically unsaturated monomer or a monomer mixture of different ethylenically unsaturated monomers,
(b) 0.5 to 25% by weight of a triglyceride or a mixture of different triglycerides, wherein the triglyceride or triglyceride mixture is ricinus or castor oil; and
(c) 0.1 to 10% by weight of a photoinitiator system which activates the polymerisation of the ethylenically unsaturated monomer(s) upon exposure to actinic radiation,
wherein the composition is a homogeneous, clear and, at 20° C., liquid mixture.

2. A composition of claim 1 wherein the triglyceride is the triglyceride of ricinoleic acid.

3. A composition of claim 1 wherein the ethylenically unsaturated monomer is at least difunctional.

4. A composition of claim 3 wherein the composition comprises less than 10% by weight of monofunctional ethylenically unsaturated monomers.

5. A composition of claim 1 wherein the ethylenically unsaturated monomer is an ethoxylated bisphenol-A-diacrylate.

6. A composition of claim 5 wherein the ethylenically unsaturated monomer is a compound having the following structural formula:

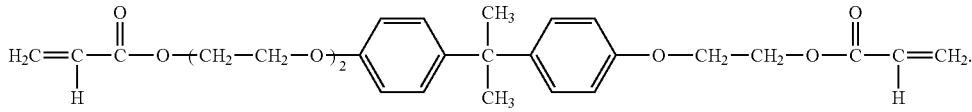

7. A composition of claim 1 wherein the viscosity of the ethylenically unsaturated monomer or monomer mixture is at least 900 mPa·s.

8. A composition of claim 1 wherein the modulus of the difference between the refractive indices of components (a) and (b) is at least 0.01.

9. A composition of claim 1 wherein the composition comprises at most 5% by weight of organic solvent.

10. A composition of claim 1 wherein the photoinitiator system activates the polymerisation of the ethylenically unsaturated monomer(s) upon exposure to visible light.

11. A composition of claim 1 wherein the composition comprises an antioxidant.

12. A composition of claim 11 wherein the antioxidant is selected from the group consisting of vitamin C, ascorbylpalmitate, micellarly solubilised vitamin C and vitamin E as well as mixtures thereof.

13. An element comprising a component which is obtainable by exposure of a polymerisable composition of claim 1 to actinic radiation.

14. An element of claim 13 comprising a hologram which is obtainable by the exposure of the photopolymerisable composition to modulated radiation carrying holographic information.

15. A method of forming a light-resistant hologram in a photopolymerisable layer on a substrate surface comprising the exposure of a layer of a photopolymerisable composition of claim 1 to modulated radiation carrying holographic information.

16. A method of claim 15 wherein the exposure to modulated radiation is carried out in a contact copying process.

17. A method of forming a light-resistant hologram using the composition of claim 1 wherein the formation of the hologram is carried out by moulding or casting of a surface hologram and exposure to actinic radiation.

* * * * *